(12) United States Patent
Saito et al.

(10) Patent No.: US 7,737,467 B2
(45) Date of Patent: Jun. 15, 2010

(54) NITRIDE SEMICONDUCTOR DEVICE WITH A HOLE EXTRACTION ELECTRODE

(75) Inventors: Wataru Saito, Kanagawa-ken (JP); Masaaki Onomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 809 days.

(21) Appl. No.: 11/507,598

(22) Filed: Aug. 22, 2006

(65) Prior Publication Data
US 2007/0200143 A1    Aug. 30, 2007

(30) Foreign Application Priority Data
Aug. 24, 2005    (JP)    .............. 2005-242534

(51) Int. Cl.
*H01L 31/0304*    (2006.01)
(52) U.S. Cl. .............. 257/192; 257/20; 257/24; 257/E21.395
(58) Field of Classification Search .............. 257/20, 257/24, 38, 39, E21.395, E21.399, 192; 438/172
See application file for complete search history.

(56) References Cited

U.S. PATENT DOCUMENTS

| | | | |
|---|---|---|---|
| 6,100,549 A * | 8/2000 | Weitzel et al. | .............. 257/194 |
| 6,555,851 B2 | 4/2003 | Morizuka | |
| 6,689,652 B2 | 2/2004 | Morizuka | |
| 6,706,574 B2 | 3/2004 | Brar | |
| 6,908,799 B2 | 6/2005 | Morizuka | |
| 7,038,252 B2 | 5/2006 | Saito et al. | |
| 2001/0025965 A1 * | 10/2001 | Morizuka | .............. 257/194 |
| 2005/0062069 A1 * | 3/2005 | Saito et al. | .............. 257/213 |
| 2005/0067693 A1 | 3/2005 | Nihei et al. | |
| 2006/0043501 A1 | 3/2006 | Saito et al. | |
| 2006/0054924 A1 | 3/2006 | Saito et al. | |

FOREIGN PATENT DOCUMENTS

JP    2001-168111    6/2001

OTHER PUBLICATIONS

U.S. Appl. No. 11/739,874, filed Apr. 25, 2007, Saito, et al.
U.S. Appl. No. 12/145,980, filed Jun. 25, 2008, Saito.

* cited by examiner

*Primary Examiner*—Marcos D Pizarro
*Assistant Examiner*—Abul Kalam
(74) *Attorney, Agent, or Firm*—Oblon, Spivak, McClelland, Maier & Neustadt, L.L.P.

(57) ABSTRACT

A nitride semiconductor device comprises: a laminated body; a first and second main electrode provided in a second and third region, respectively, adjacent to either end of the first region on the major surface of the laminated body; and a third main electrode. The laminated body includes a first semiconductor layer of a nitride semiconductor and a second semiconductor layer of a nondoped or n-type nitride semiconductor having a wider bandgap than the first semiconductor layer, the second semiconductor layer being provided on the first semiconductor layer. The third main electrode is provided on the major surface of the laminated body and opposite to the control electrode across the second main electrode.

20 Claims, 20 Drawing Sheets

NITRIDE SEMICONDUCTOR DEVICE WITH A HOLE EXTRACTION ELECTRODE

CROSS-REFERENCE TO RELATED APPLICATIONS

This application is based upon and claims the benefit of priority from the prior Japanese Patent Application No. 2005-242534, filed on Aug. 24, 2005; the entire contents of which are incorporated herein by reference.

BACKGROUND OF THE INVENTION

1. Field of the Invention

This invention relates to a nitride semiconductor device structure, and more particularly to a nitride semiconductor device having the structure of a heterojunction field effect transistor based on a heterostructure.

2. Background Art

Circuits such as switching power supplies and inverters are based on power semiconductor devices including switching devices and diodes, which are required to have such characteristics as high withstand voltage and low on-resistance ($R_{ON}$). There is a tradeoff relation between the withstand voltage and the on-resistance ($R_{ON}$), which relation depends on the device material. With the progress of technology development, the on-resistance ($R_{ON}$) of power semiconductor devices is reduced to nearly the limit for silicon (Si), which has been the main device material. For further reduction of on-resistance ($R_{ON}$), the device material needs to be changed. For example, wide bandgap semiconductors such as gallium nitride (GaN), aluminum gallium nitride (AlGaN), and other nitride semiconductors and silicon carbide (SiC) can be used as switching device materials to improve the tradeoff relation determined by the device material, thereby dramatically reducing on-resistance ($R_{ON}$).

On the other hand, nitride semiconductors such as GaN and AlGaN can be used for heterojunction field effect transistors (HFETS) based on the AlGaN/GaN heterostructure. HFETs achieve low on-resistance through the high mobility of the heterointerface channel and the high electron concentration due to piezopolarization caused by heterointerface strain.

An HFET structure based on nitride semiconductors is disclosed (JP2001-168111A). In this structure, a source electrode, a gate electrode, and a drain electrode are formed on an n-type GaN channel layer, and a p-type GaN layer is formed under the n-type GaN channel layer to extract holes into the p-type GaN layer.

SUMMARY OF THE INVENTION

According to an aspect of the invention, there is provided a nitride semiconductor device comprising: a laminated body including a first semiconductor layer of a nitride semiconductor and a second semiconductor layer of a nondoped or n-type nitride semiconductor having a wider bandgap than the first semiconductor layer, the second semiconductor layer being provided on the first semiconductor layer; a control electrode provided in a first region on a major surface of the laminated body; a first and second main electrode provided in a second and third region, respectively, adjacent to either end of the first region on the major surface of the laminated body; and a third main electrode provided on the major surface of the laminated body and opposite to the control electrode across the second main electrode.

According to other aspect of the invention, there is provided a nitride semiconductor device comprising: a laminated body including a first semiconductor layer of a nitride semiconductor and a second semiconductor layer of a nondoped or n-type nitride semiconductor having a wider bandgap than the first semiconductor layer, the second semiconductor layer being provided on the first semiconductor layer; a control electrode provided directly, or via an insulating film, in a first region on a major surface of the laminated body; a first and second main electrode provided in a second and third region, respectively, adjacent to either end of the first region on the major surface of the laminated body; and a third main electrode provided on the major surface of the laminated body and opposite to the control electrode across the second main electrode, the spacing between the control electrode and the second main electrode being larger than the spacing between the second main electrode and the third main electrode.

According to other aspect of the invention, there is provided a nitride semiconductor device comprising: a laminated body including a first semiconductor layer of a nitride semiconductor and a second semiconductor layer of a nondoped or n-type nitride semiconductor having a wider bandgap than the first semiconductor layer, the second semiconductor layer being provided on the first semiconductor layer; a source electrode provided on the laminated body; a drain electrode provided on the laminated body; a gate electrode provided between the source electrode and the drain electrode on the laminated body; a hole extracting electrode provided on the laminated body and opposite to the gate electrode across the drain electrode; a first insulating film overlying the gate electrode: and a field plate electrode provided on the first insulating film and connected to the source electrode or the gate electrode.

BRIEF DESCRIPTION OF THE DRAWINGS

FIG. 14A is a top view, FIG. 14B is a cross section along line A-A', and FIG. 14C is a cross section along line B-B';

FIG. 15A is a top view, and FIG. 15B is a cross section along line A-A';

DETAILED DESCRIPTION OF THE INVENTION

The embodiment of the invention will now be described with reference to the drawings.

Figure 1:
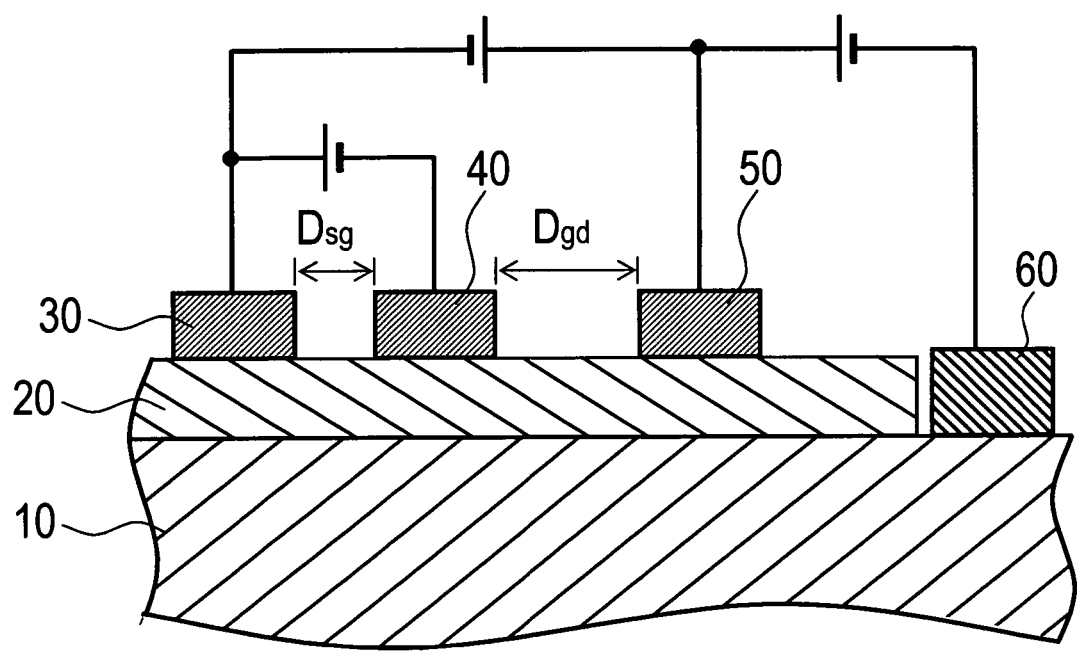
FIG. 1 is a cross section illustrating an example of a nitride semiconductor HFET structure according to an embodiment of the invention.

FIG. 1 is a cross section illustrating an example of a nitride semiconductor HFET structure according to an embodiment of the invention.

As shown in this figure, a barrier layer 20 of undoped AlGaN or the like is laminated on a major surface of a channel layer of undoped GaN or the like. A gate electrode 40 is provided on a major surface of the barrier layer 20 to form a Schottky junction. The barrier layer 20 is formed from a nitride semiconductor having a wider bandgap than the channel layer 10. A source electrode 30 and a drain electrode 50 are provided on either side of the gate electrode 40. The source electrode 30 is electrically connected to the drain electrode 50 so that the drain electrode 50 side is positive, and the gate electrode 40 is electrically connected to the source electrode 30 so that the source electrode side is positive. Here, a switching device having a high withstand voltage can be obtained by asymmetric formation of the electrodes in which the distance Dgd between the gate electrode 40 and the drain electrode 50 is longer than the distance Dsg between the source electrode 30 and the gate electrode 40.

In this embodiment, a hole extracting electrode 60 is provided on the GaN channel layer 10 so as to sandwich the drain electrode 50 with the gate electrode 40. In this example, the side face of the hole extracting electrode 60 is not in contact with the side face of the end portion of the AlGaN barrier layer 20. No two-dimensional electron gas (2DEG) is formed at the junction between the hole extracting electrode 60 and the GaN layer 10.

The circuit between the source electrode 30 and the drain electrode 50 can be extended to the hole extracting electrode 60 to apply a reverse bias to the hole extracting electrode 60. This structure enables holes generated by avalanche breakdown to be extracted through the hole extracting electrode 60, thereby improving avalanche withstand characteristics.

While the gate electrode 40 forms a Schottky junction with the AlGaN layer 20 in FIG. 1, a gate insulating film (not shown) may be sandwiched therebetween to form a MIS gate structure, which also achieves the same effects as this embodiment.

FIG. 2 is a conceptual diagram illustrating the avalanche withstand mechanism of the nitride semiconductor device according to the embodiment of the invention.

Figure 3A:
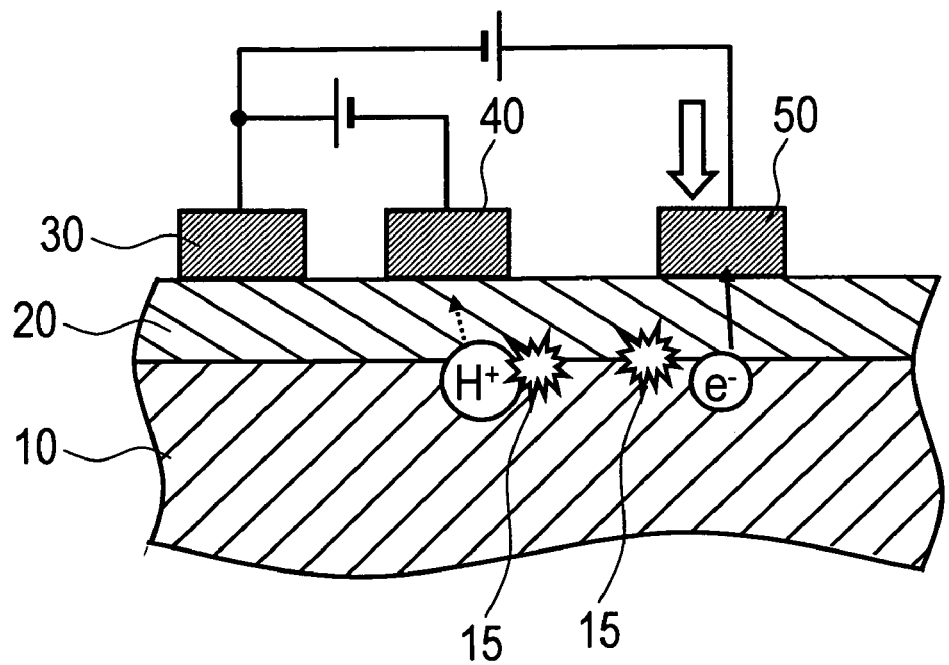
FIG. 3 is a conceptual diagram illustrating the operation regarding the HFET structure of a comparative example.
Figure 3B:
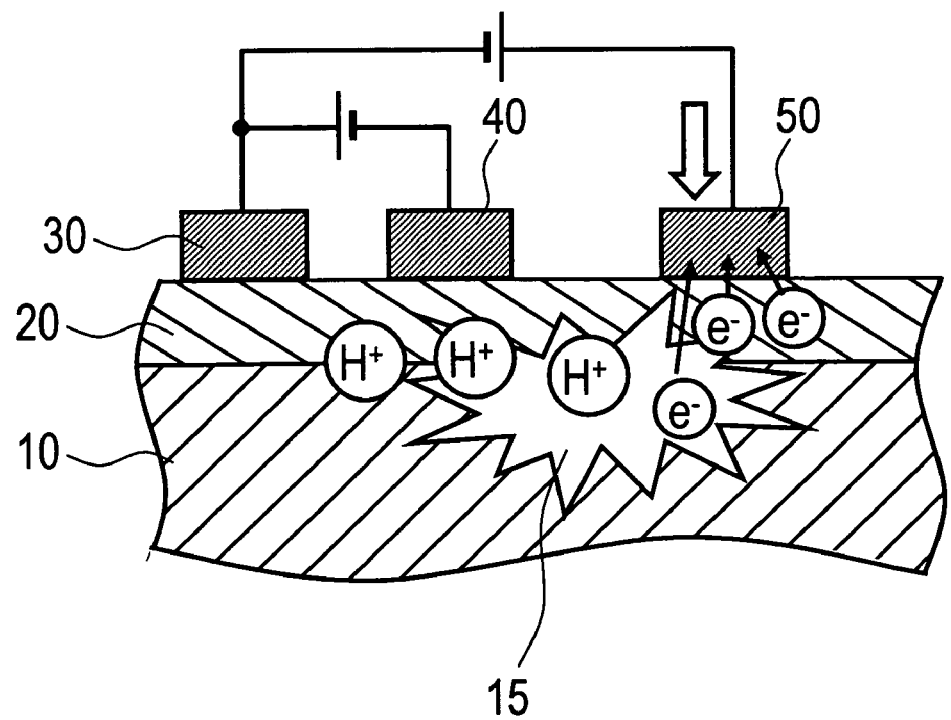

FIG. 3 is a conceptual diagram for illustrating the operation regarding the HFET structure of a comparative example.

Note that with regard to FIG. 2 and the following figures, elements similar to those described with reference to any previous figure are marked with the same reference numerals and not described in detail as appropriate.

First, reference is made to FIG. 3 to describe the operation of an HFET of the comparative example. The basic structure of the HFET of the comparative example is similar to that shown in FIG. 1 except that no hole extracting electrode 60 is provided.

In the HFET of the comparative example, application of a high voltage to the drain electrode 50 increases the strength of electric field between the gate electrode 40 and the drain electrode 50. As a result, electrons injected from the source electrode 30 are accelerated by the electric field between the gate electrode 40 and the drain electrode 50 and collide with lattice to generate electron-hole pairs (EHPs). Because this occurs in a cascaded manner, carriers are amplified, and an avalanche breakdown 15 occurs at the end portion of the gate electrode 40 or at the end portion of the drain electrode 50. Electrons generated by the avalanche breakdown 15 move to the drain electrode 50 and are extracted out. On the other hand, holes flow to the gate electrode 40. However, because of the presence of the AlGaN barrier layer 20, the valence band has a discontinuity under the band condition at the interface between the GaN channel layer 10 and the AlGaN barrier layer 20, where the holes are accumulated. This results in further enhancing the electric field and increasing the avalanche current, and the HFET is eventually broken down.

Figure 2A:
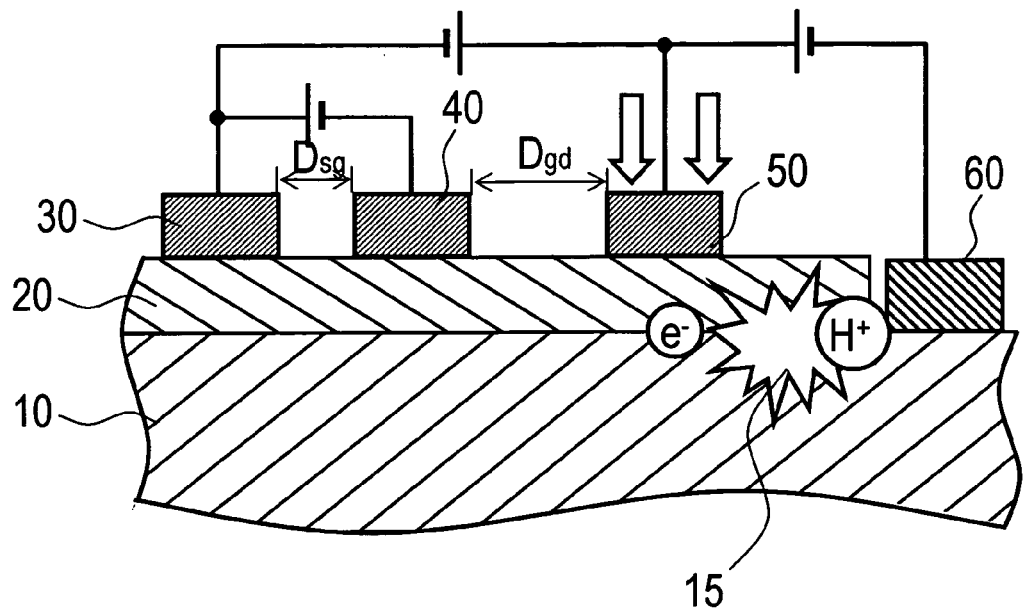
FIG. 2 is a conceptual diagram illustrating the avalanche withstand mechanism of the nitride semiconductor device according to the embodiment of the invention.
Figure 2B:
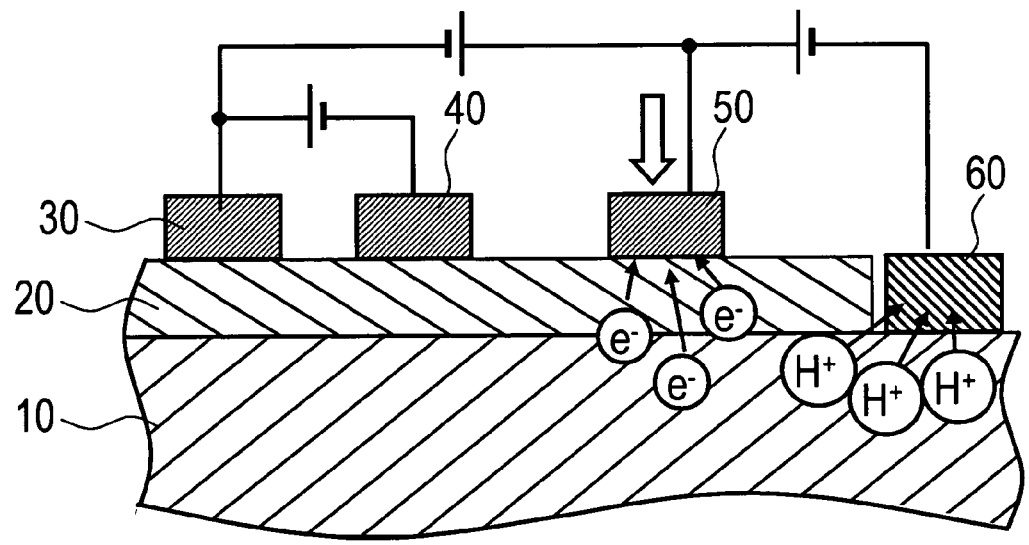

In contrast, FIG. 2 shows an HFET of this embodiment. As shown in FIG. 2A, a high voltage is applied to the drain electrode 50, whereas a negative voltage is applied to the hole extracting electrode 60 relative to the drain electrode 50. When the voltage applied to the drain electrode 50 increases, an avalanche breakdown 15 occurs as shown in FIG. 2A. Electrons generated at this time are extracted by the drain electrode 50 as shown in FIG. 2B. On the other hand, holes generated by the avalanche breakdown 15 can be extracted by the hole extracting electrode 60 that is negatively biased relative to the drain electrode 50, thereby improving avalanche withstand capability. Here, holes can be rapidly extracted because they are not affected by the energy barrier at the interface between the GaN layer 10 and the AlGaN layer 20. Furthermore, the gate electrode 40 is not affected by holes. Thus the nitride semiconductor device can be normally operated without burdening the gate driving circuit.

In this way, according to this embodiment, holes generated by the avalanche breakdown 15 are rapidly extracted by the hole extracting electrode 60. Thus the nitride semiconductor device can avoid breakdown even under high voltage, and the avalanche withstand capability can be improved while maintaining low on-resistance.

The foregoing has described the avalanche withstand mechanism of the nitride semiconductor device according to this embodiment.

Next, other examples of the nitride semiconductor device according to this embodiment are described.

Figure 4:
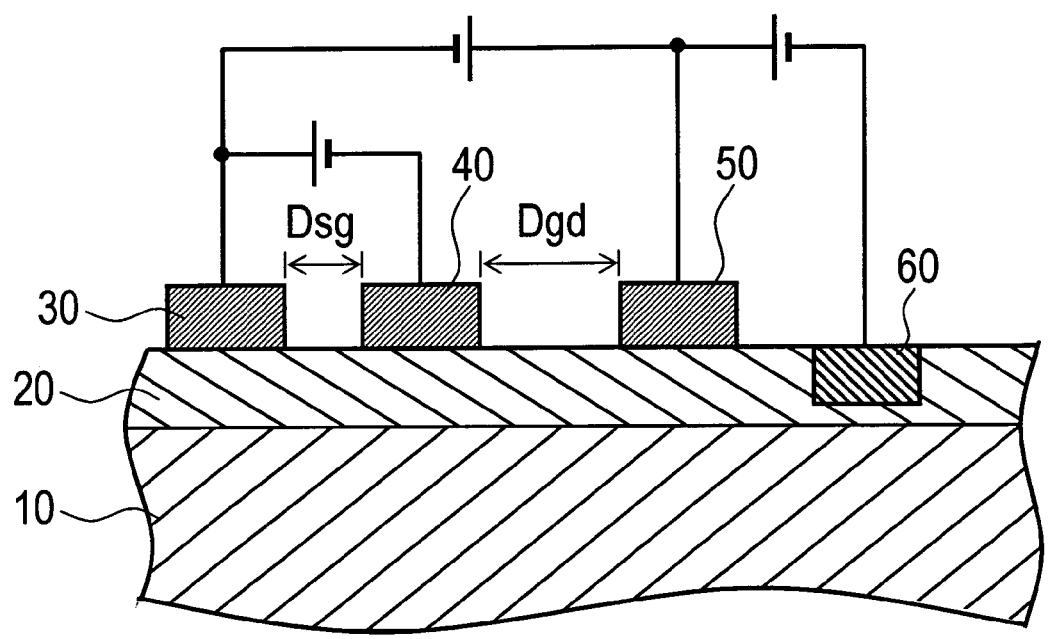
FIG. 4 is a cross section showing a second example of the nitride semiconductor device of this embodiment.

FIG. 4 is a cross section showing a second example of the nitride semiconductor device of this embodiment.

In this example, the lower face of the hole extracting electrode 60 is buried into the AlGaN barrier layer 20 so as to be close to the underlying GaN channel layer 10. The film thickness of the AlGaN barrier layer 20 sandwiched between the hole extracting electrode 60 and the GaN channel layer 10 is decreased so that holes can be tunneled through the AlGaN barrier layer 20 and hence rapidly extracted. As a result, the avalanche withstand capability can be improved while maintaining low on-resistance.

Figure 5:
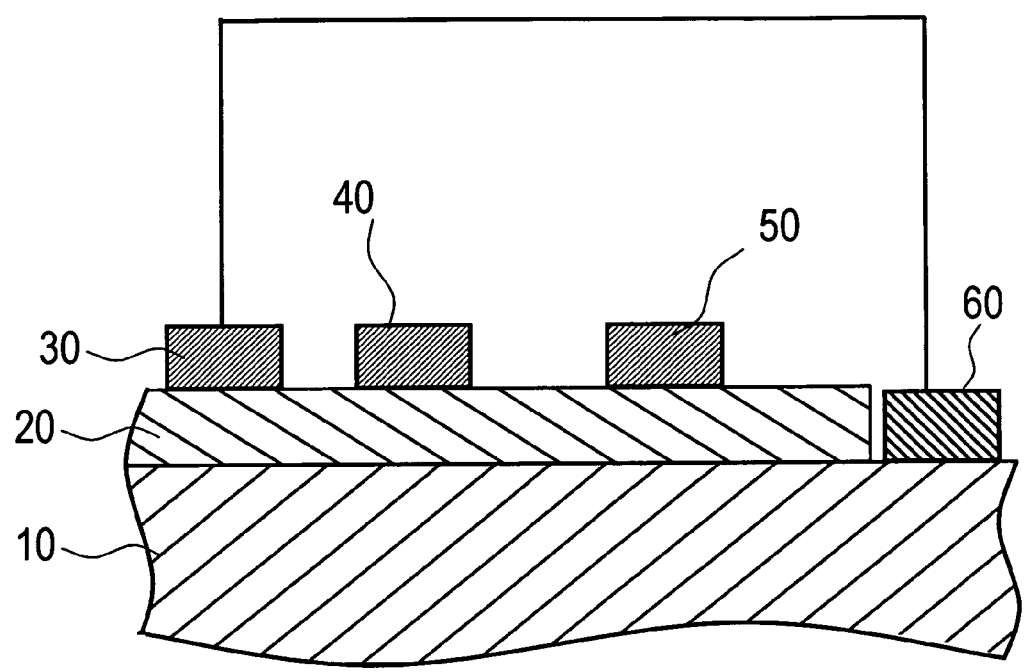
FIG. 5 is a cross section showing a third example of the nitride semiconductor device of this embodiment.

FIG. 5 is a cross section showing a third example of the nitride semiconductor device of this embodiment.

In this example, the hole extracting electrode 60 is connected to the source electrode 30. More specifically, in order to extract holes through the hole extracting electrode 60 in this embodiment, the hole extracting electrode 60 only needs to be negatively biased relative to the drain electrode 50. Thus the source electrode 30 and the hole extracting electrode 60 can be commonly connected to be subjected to the same negative bias. This eliminates the need of a circuit for biasing the hole extracting electrode 60, and the avalanche withstand capability can be improved.

Figure 6:
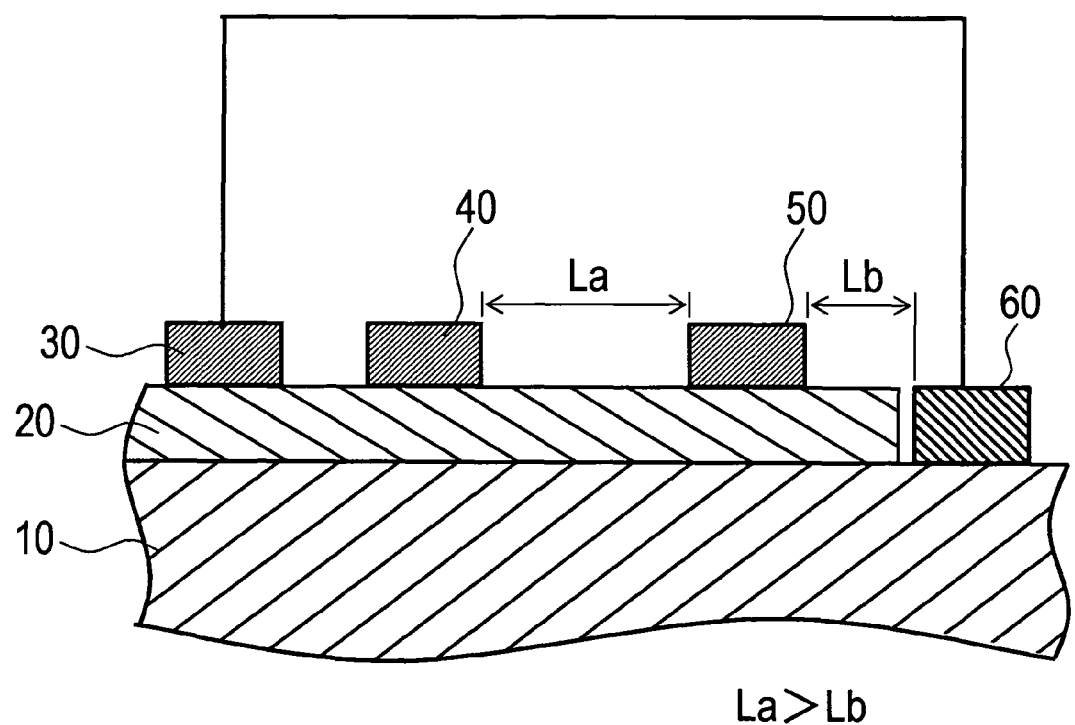
FIG. 6 is a cross section showing a fourth example of the nitride semiconductor device of this embodiment.

FIG. 6 is a cross section illustrating a fourth example of the nitride semiconductor device of this embodiment.

In this example, the distance La between the drain electrode 50 and the gate electrode 40 is longer than the distance Lb between the drain electrode 50 and the hole extracting electrode 60. That is, the voltage between the gate electrode 40 and the source electrode 30 is set lower than that between the drain electrode 50 and the source electrode 30. This further ensures that holes generated by avalanche breakdown can be extracted through the hole extracting electrode 60.

More specifically, in order to ensure that holes generated by avalanche breakdown are extracted through the hole extracting electrode 60, it is more desirable to allow avalanche breakdown between the drain electrode 50 and the hole extracting electrode 60 than between the gate electrode 40 and the hole extracting electrode 60.

In this example, because the distance La between the drain electrode 50 and the gate electrode 40 is longer than the distance Lb between the drain electrode 50 and the hole extracting electrode 60, the electric field strength between the hole extracting electrode 60 and the drain electrode 50 is higher than the electric field strength between the gate electrode 40 and the drain electrode 50. Thus it is ensured that avalanche breakdown occurs between the hole extracting electrode 60 and the drain electrode 50, and nearly all generated holes are extracted through the hole extracting electrode 60, thereby achieving high avalanche withstand capability.

Figure 7:
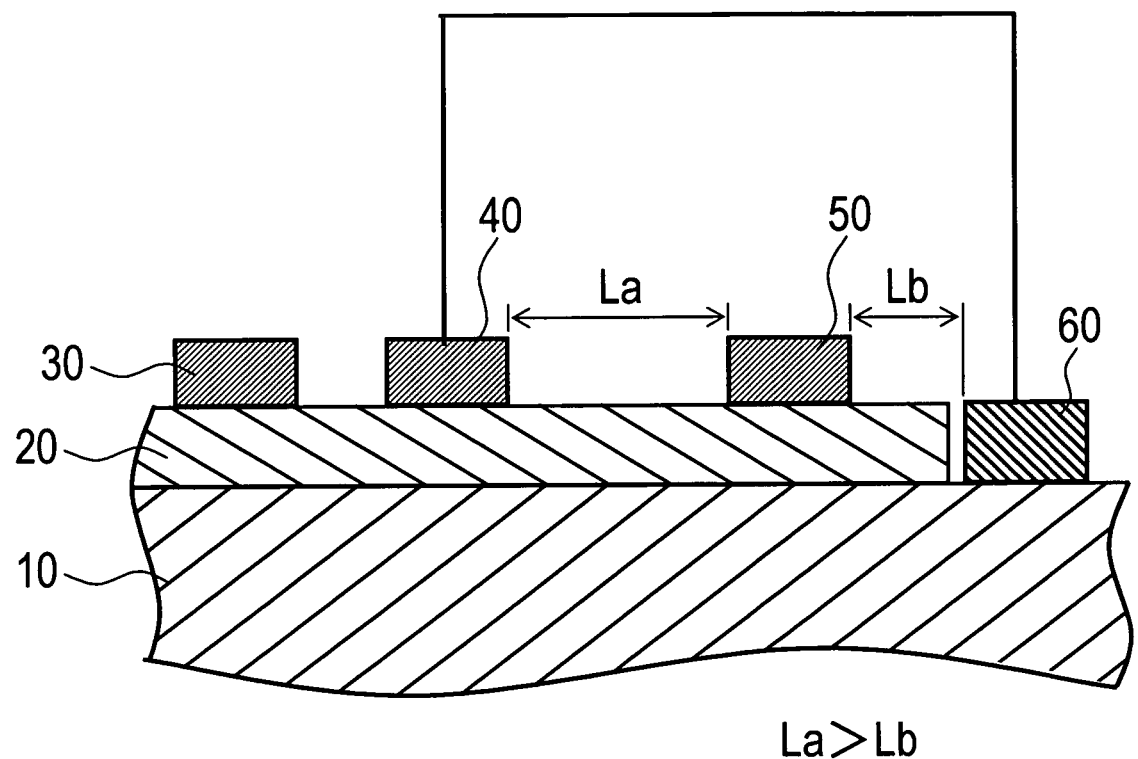
FIG. 7 is a cross section showing a fifth example of the nitride semiconductor device of this embodiment.

FIG. 7 is a cross section showing a fifth example of the nitride semiconductor device of this embodiment.

In this example, the hole extracting electrode 60 is connected to the gate electrode 40 and made equipotential. More specifically, in order to extract holes through the hole extracting electrode 60, the hole extracting electrode 60 only needs to be negatively biased relative to the drain electrode.

Thus in this embodiment, the hole extracting electrode 60 and the gate electrode 40 can be commonly connected to be subjected to the same negative bias relative to the drain electrode 50. Again, this advantageously eliminates the need of a circuit for biasing the hole extracting electrode 60.

Figure 8:
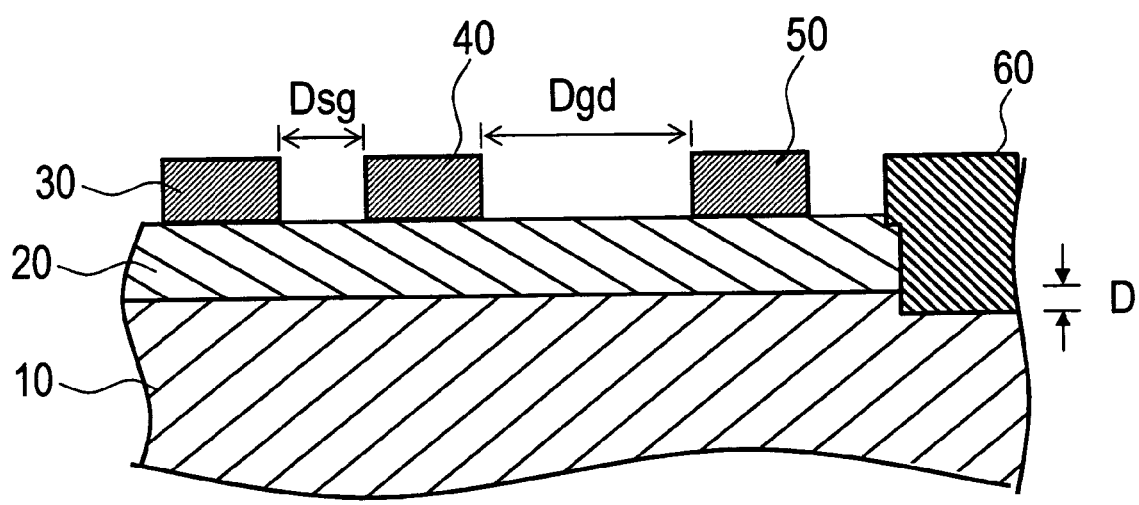
FIG. 8 is a cross section showing a sixth example of the nitride semiconductor device of this embodiment.

FIG. 8 is a cross section showing a sixth example of the nitride semiconductor device of this embodiment.

In this example, the GaN channel layer 10 in contact with the hole extracting electrode 60 is drilled to a depth of D where the hole extracting electrode 60 is buried into the GaN layer 10. Burying the hole extracting electrode 60 into the GaN layer 10 in this manner can further ensure that holes are extracted. Note that the connection among the electrodes in this example can use any configurations described above with reference to FIGS. 1, 5, and 7.

Figure 9:
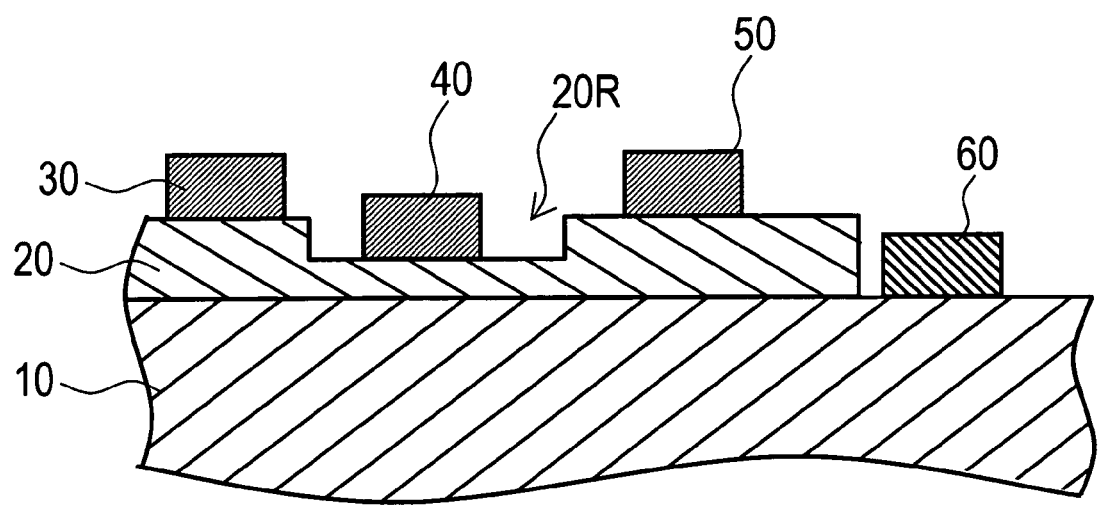
FIG. 9 is a cross section showing a seventh example of the nitride semiconductor device of this embodiment.

FIG. 9 is a cross section showing a seventh example of the nitride semiconductor device of this embodiment.

In this example, the AlGaN barrier layer 20 has a recess 20R between the source electrode 30 and the drain electrode 50, and the gate electrode 40 is provided so as to be received in the recess 20R.

By decreasing the thickness of the AlGaN barrier layer 20 directly under the gate electrode 40 in this manner, the electron concentration at the heterointerface with the GaN channel layer 10 can be selectively decreased, and the device can be turned off when no gate voltage is applied. That is, a switching device of the so-called "normally-off type" can be achieved, which can prevent short circuit and simplify the gate driving circuit. Furthermore, the hole extracting electrode 60 improves avalanche withstand capability while maintaining low on-resistance.

In the example illustrated in FIG. 9, the recess gate structure is used to achieve normally-off operation. However, as described later in detail, normally-off operation can also be achieved by other configurations such as a p-type InGaN layer provided under the gate electrode 40. Such variations are also encompassed within the scope of the invention.

Figure 10:
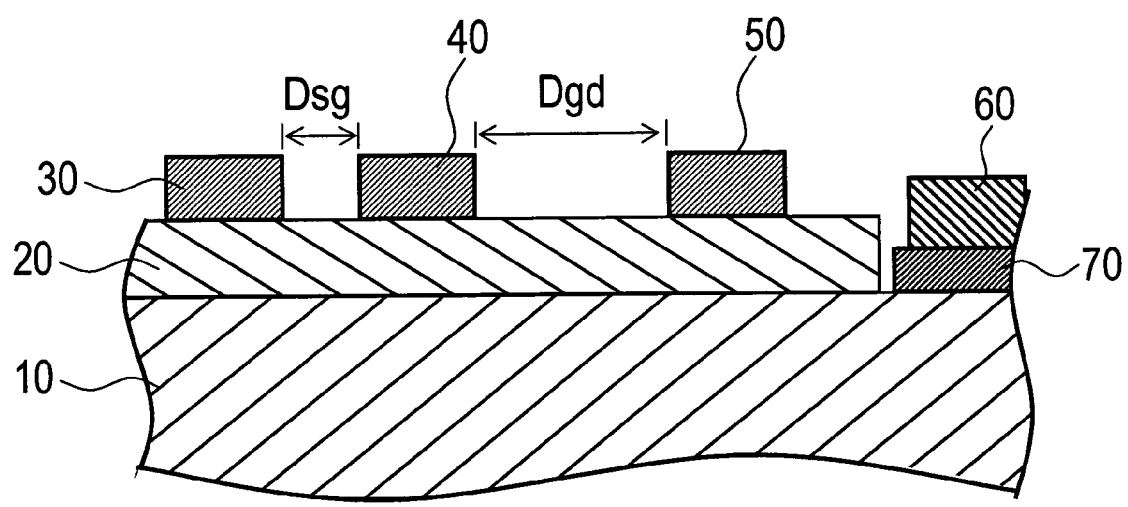
FIG. 10 is a cross section showing an eighth example of the nitride semiconductor device of this embodiment.

FIG. 10 is a cross section showing an eighth example of the nitride semiconductor device of this embodiment.

In this example, a contact layer 70 is sandwiched between the hole extracting electrode 60 and the GaN channel layer 10. The contact layer 70 can illustratively be made of p-type InGaN. The contact layer 70 decreases the contact resistivity for holes, and can facilitate extracting holes more rapidly.

In order to decrease the contact resistance for holes, it is desirable to form the contact layer 70 from a narrow bandgap semiconductor that is doped p-type in high concentration. From this viewpoint, it is more desirable to use p-type InGaN than p-type GaN for the material of the contact layer 70. Here, the p-type InGaN layer may be single crystal, polycrystal, or amorphous.

Figure 11:
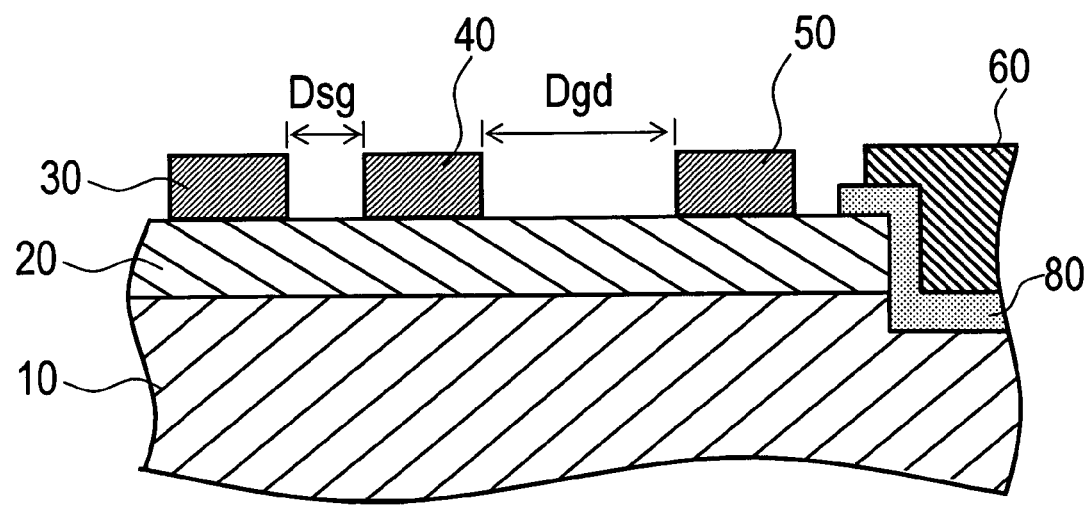
FIG. 11 is a cross section showing a ninth example of the nitride semiconductor device of this embodiment.

FIG. 11 is a cross section showing a ninth example of the nitride semiconductor device of this embodiment.

In this example, a contact layer 80 is provided between the hole extracting electrode 60, and the GaN channel layer 10 and the AlGaN barrier layer 20. The contact layer 80 extending around the side face of the hole extracting electrode 60 can further accelerate the inflow of holes.

The contact layer 80 can illustratively be made of p-type polycrystalline silicon. Polycrystalline silicon is easy to deposit, and low contact resistance can be achieved by a low-temperature process. Alternatively, instead of polycrystalline silicon, the contact layer 80 may be made of amorphous p-type silicon, polycrystalline or amorphous p-type InGaN or p-type GaN.

Figure 12:
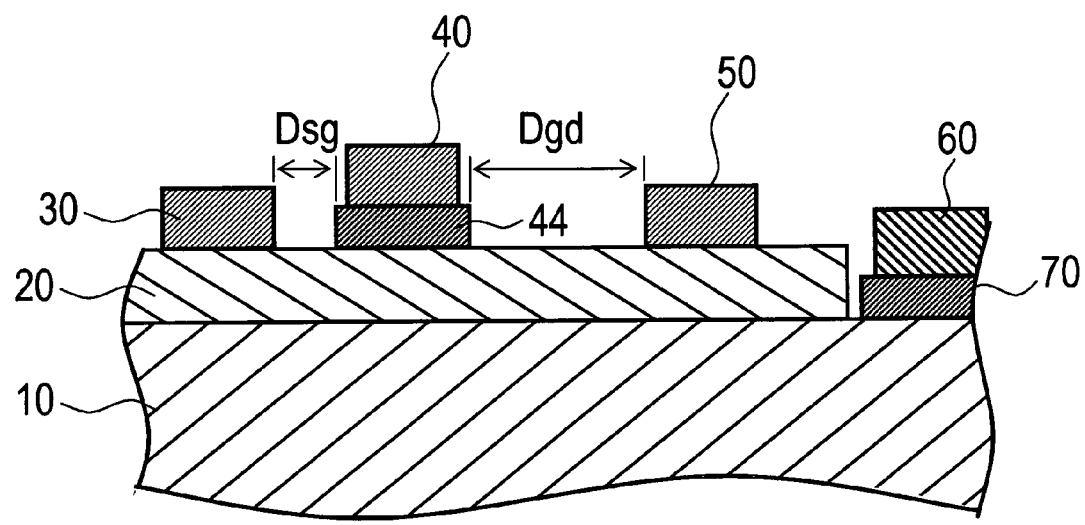
FIG. 12 is a cross section showing a tenth example of the nitride semiconductor device of this embodiment.

FIG. 12 is a cross section showing a tenth example of the nitride semiconductor device of this embodiment.

In this example, a p-type InGaN layer 44 is formed under the gate electrode 40. This depletes the 2DEG channel under the gate electrode 40 and achieves normally-off operation. The p-type InGaN layer 44 can be formed simultaneously with the contact layer 70.

Figure 13:
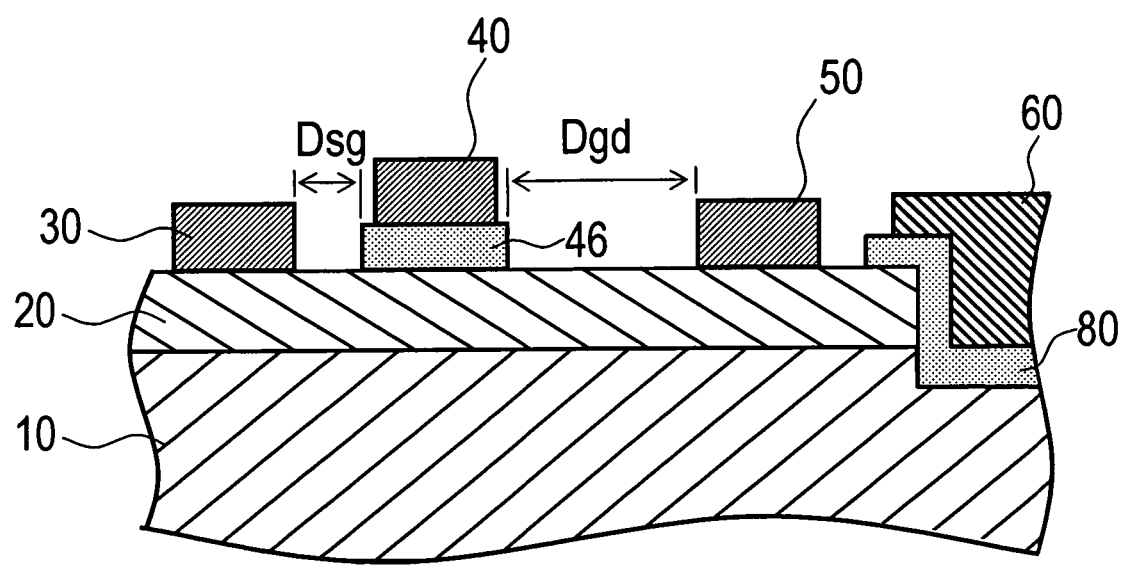
FIG. 13 is a cross section showing an eleventh example of the nitride semiconductor device of this embodiment.

Alternatively, as shown in FIG. 13, normally-off operation can also be achieved by using a p-type polycrystalline silicon layer to form an under-gate semiconductor layer 46 and a contact layer 80.

Figure 14:
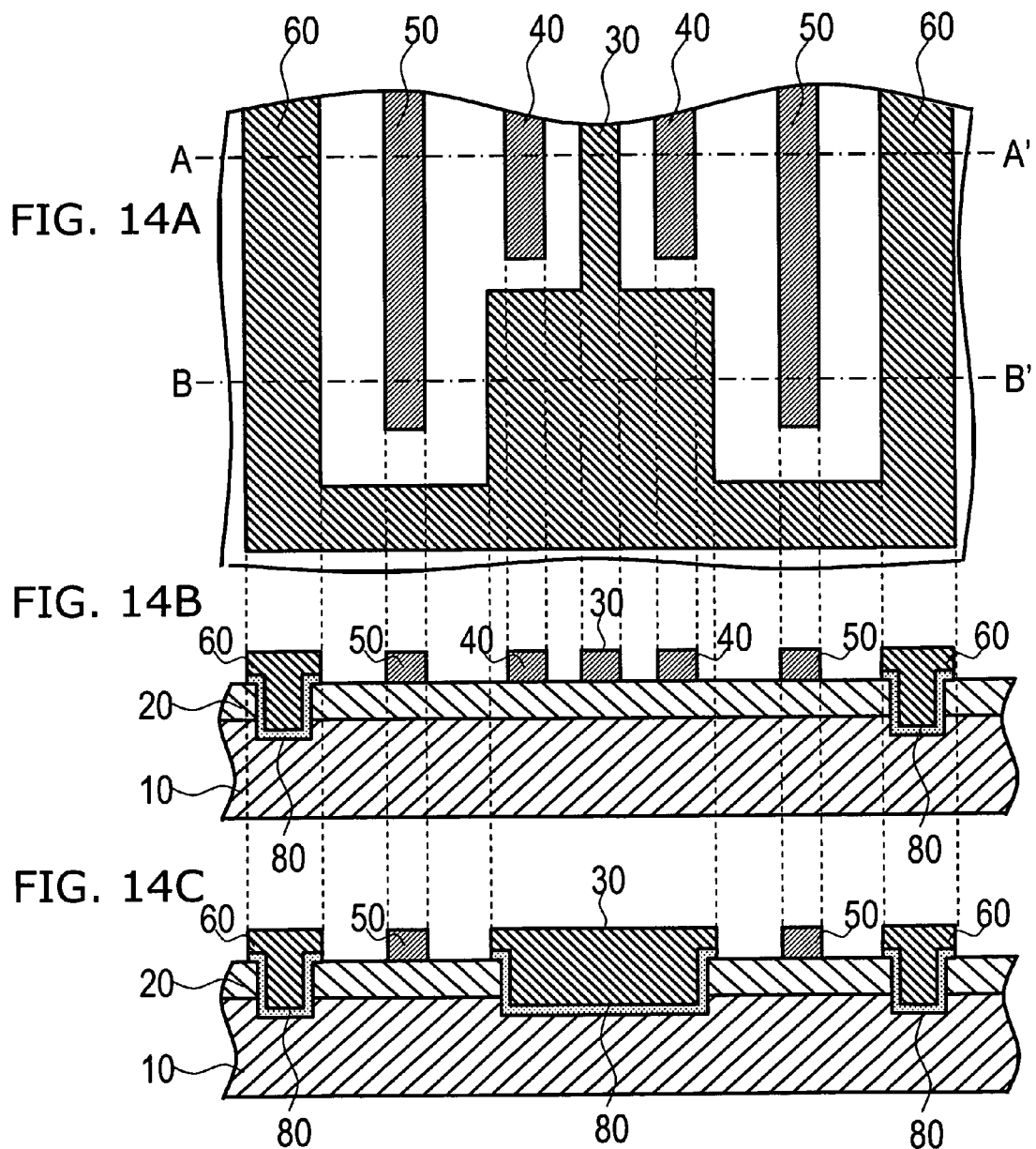
FIG. 14 shows a twelfth example of the nitride semiconductor device of this embodiment, where

FIG. 14 shows a twelfth example of the nitride semiconductor device of this embodiment, where FIG. 14A is a top view, FIG. 14B is a cross section along line A-A', and FIG. 14C is a cross section along line B-B'.

In this example, as shown in FIG. 14A, the gate electrode 40 and the drain electrode 50 arranged in parallel on the major surface of the AlGaN barrier layer 20 are surrounded by the source electrode 30, which is provided on the gate electrode side, and by the hole extracting electrode 60, which is provided on the drain electrode 50 side and connected to the source electrode 30.

Typically, the amount of emission current required for ensuring avalanche withstand capability is comparable to the amount of source current in the on-state of the device. Thus the avalanche withstand capability can be improved when the area of the hole extracting electrode 60 is comparable to the area of the source electrode 30. On the other hand, when the area of the hole extracting electrode 60 increases, the chip on-resistance increases because the effective utilization ratio of the chip area decreases. From this viewpoint, it is desirable to make the hole extracting electrode 60 smaller than the source electrode 30. In addition, as shown, a hole extracting electrode 60 with a large width can be formed at the edge of the chip for shared use with the source electrode pad, which improves the utilization efficiency of the chip area.

Furthermore, as shown in FIGS. 14B and 14C, a p-type polycrystalline silicon layer 80 is provided between the hole extracting electrode 60, and the adjacent GaN channel layer 10 and the AlGaN barrier layer 20, for ohmic contact. The GaN channel layer 10 below the hole extracting electrode 60 can be drilled to a depth of D as described above with reference to FIG. 8 for facilitating extracting holes. In addition, this configuration enables device isolation.

Figure 15:
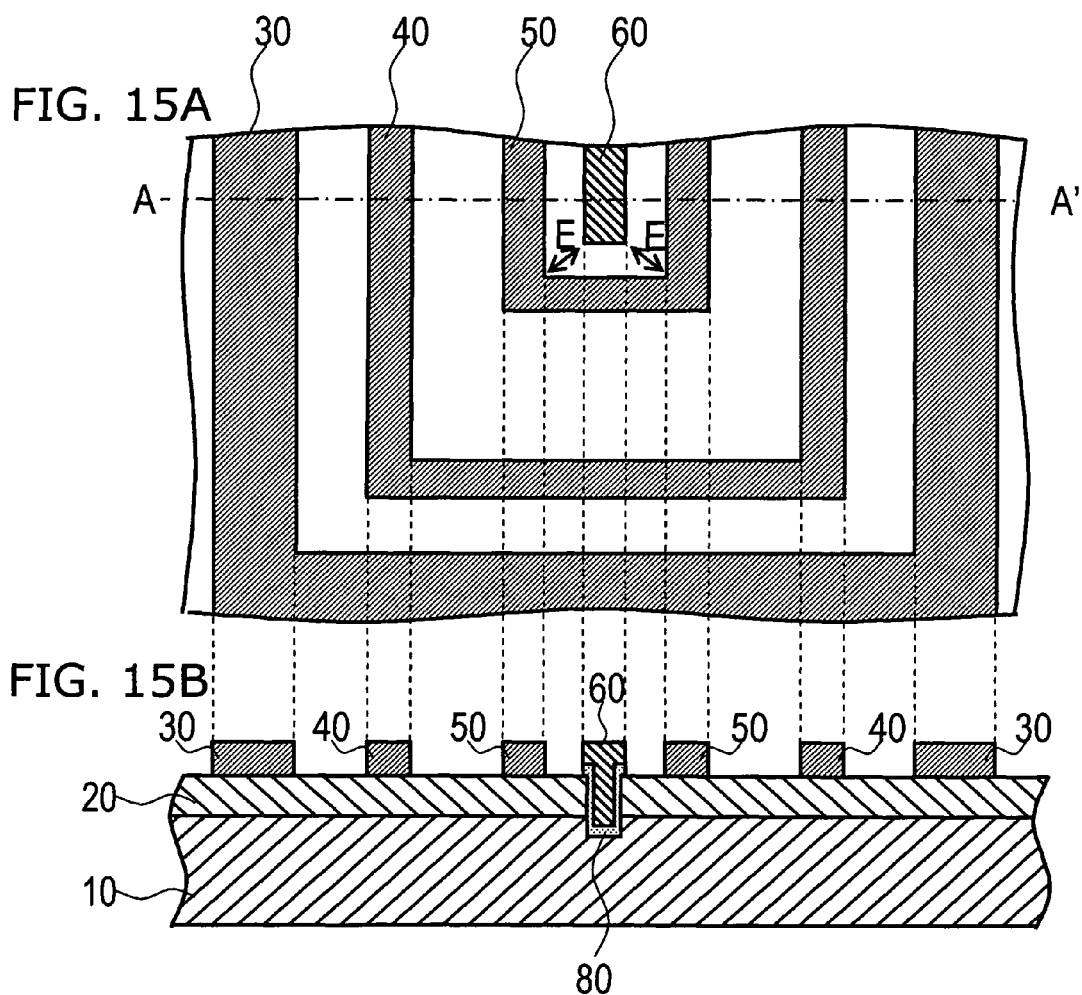
FIG. 15 shows a thirteenth example of the nitride semiconductor device of this embodiment, where

FIG. 15 shows a thirteenth example of the nitride semiconductor device of this embodiment, where FIG. 15A is a top view, and FIG. 15B is a cross section along line A-A'.

In this example, on the major surface of the AlGaN barrier layer 20, a striped hole extracting electrode 60 is surrounded by the drain electrode 50, which is surrounded from outside by the gate electrode 40, which is further surrounded from outside by the source electrode 30.

Because the drain electrode 50 subjected to a high voltage is formed to surround the hole extracting electrode 60, electric field concentration is likely to occur at the end portion (indicated by arrows E) of the hole extracting electrode 60. This ensures that avalanche breakdown occurs between the drain electrode 50 and the hole extracting electrode 60, thereby rapidly extracting holes.

In this example again, as shown in FIG. 15B, the hole extracting electrode 60 passes through the AlGaN barrier layer 20 and is buried into the GaN channel layer 10 drilled to a depth of D, thereby facilitating ejecting holes. In addition, the hole extracting electrode 60 is formed to surround the outer periphery of the device as in FIG. 14, thereby enabling device isolation.

Figure 16:
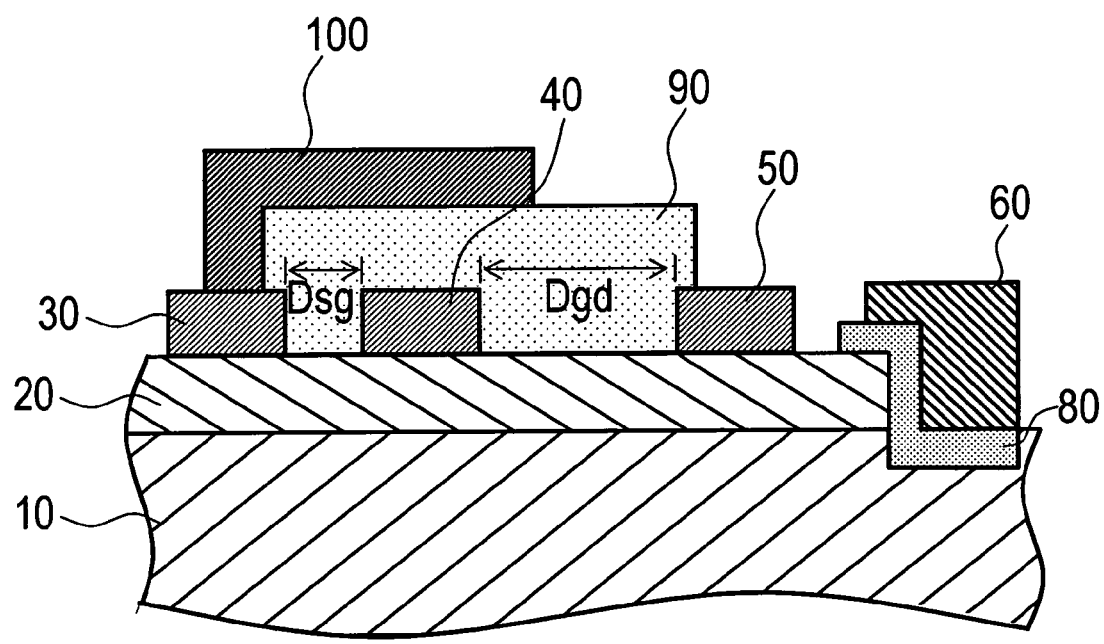
FIG. 16 is a cross section showing a fourteenth example of the nitride semiconductor device of this embodiment.

FIG. 16 is a cross section showing a fourteenth example of the nitride semiconductor device of this embodiment.

In this example, an insulating film 90 is formed to cover the gate electrode 40 from above. Furthermore, a field plate electrode 100 connected to the source electrode 30 is provided on the insulating film 90 to extend above the gate electrode 40.

The field plate electrode 100 alleviates the electric field at the end portion of the gate electrode 40 and improves the gate-drain withstand voltage. Therefore it can further ensure that avalanche breakdown occurs between the hole extracting electrode 60 and the drain electrode 50. Note that a similar effect is also achieved by connecting the field plate electrode 100 to the gate electrode 40.

Figure 17:
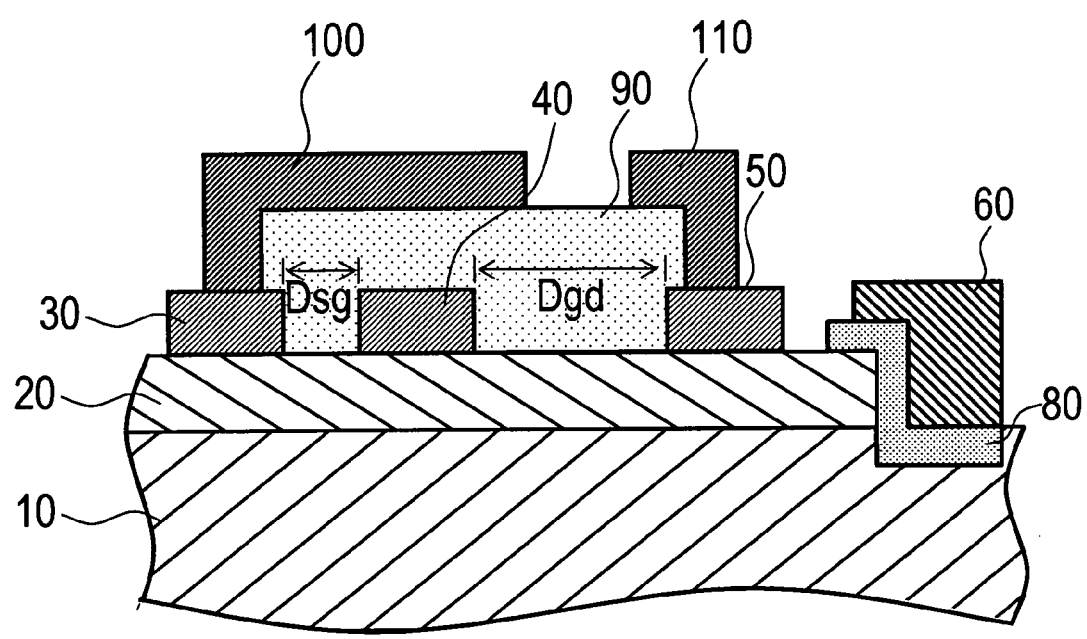
FIG. 17 is a cross section showing a fifteenth example of the nitride semiconductor device of this embodiment.

FIG. 17 is a cross section showing a fifteenth example of the nitride semiconductor device of this embodiment.

In this example, in addition to the field plate electrode 100 described above with reference to FIG. 16, a second field plate electrode 110 connected to the drain electrode 50 is provided on the insulating film 90 to extend toward the gate electrode 40.

The second field plate electrode 110 alleviates the electric field at the end portion of the drain electrode 50 and can further improve the withstand voltage between the gate electrode 40 and the drain electrode 50. Therefore it can further ensure that avalanche breakdown occurs between the hole extracting electrode 60 and the drain electrode 50. That is, it is ensured that holes generated by avalanche breakdown are ejected through the hole extracting electrode 60, thereby improving avalanche withstand capability.

Figure 18:
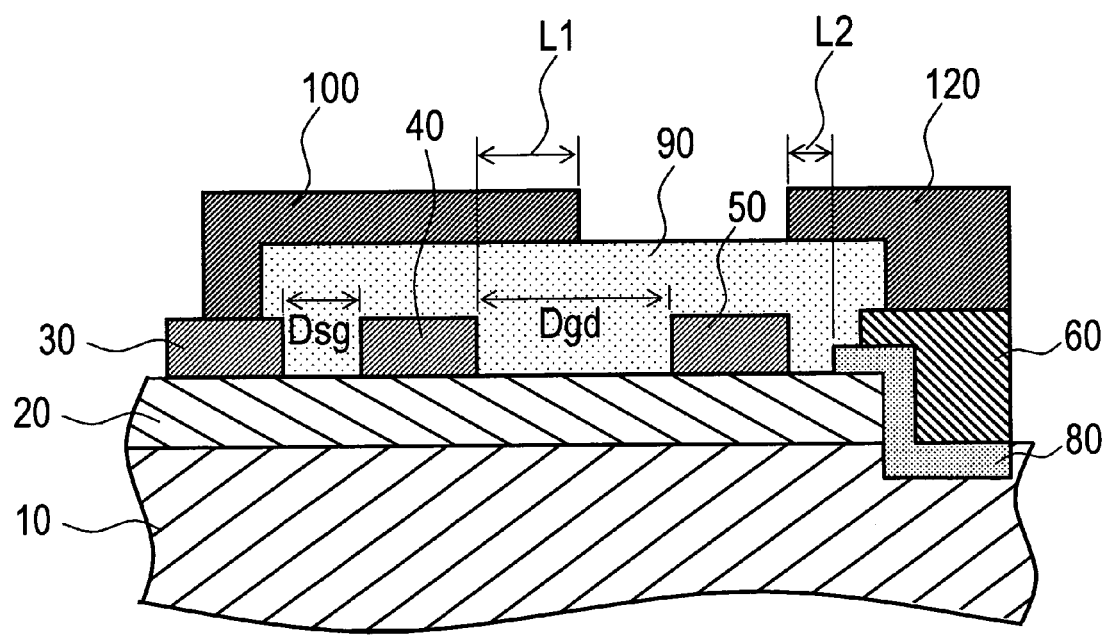
FIG. 18 is a cross section showing a sixteenth example of the nitride semiconductor device of this embodiment.

FIG. 18 is a cross section showing a sixteenth example of the nitride semiconductor device of this embodiment.

In this example, on the insulating film 90, a field plate electrode 100 connected to the source electrode 30 extends toward the gate electrode 40, and a third field plate electrode 120 connected to the hole extracting electrode 60 extends toward the drain electrode 50. Here, in order to ensure that avalanche breakdown occurs between the hole extracting electrode 60 and the drain electrode 50, it is desirable that the distance L1 from the end portion of the gate electrode 40 to the tip (on the drain side) of the field plate electrode 100 be longer than the distance L2 from the end portion of the contact layer 80 to the tip (on the drain side) of the third field plate electrode 120 (L1>L2). In this example, the third field plate electrode 120 alleviates the electric field at the end portion of the hole extracting electrode 60 and can therefore improve the withstand voltage of the entire device. It is thus ensured that avalanche breakdown occurs between the hole extracting electrode 60 and the drain electrode 50, thereby improving avalanche withstand capability.

Figure 19:
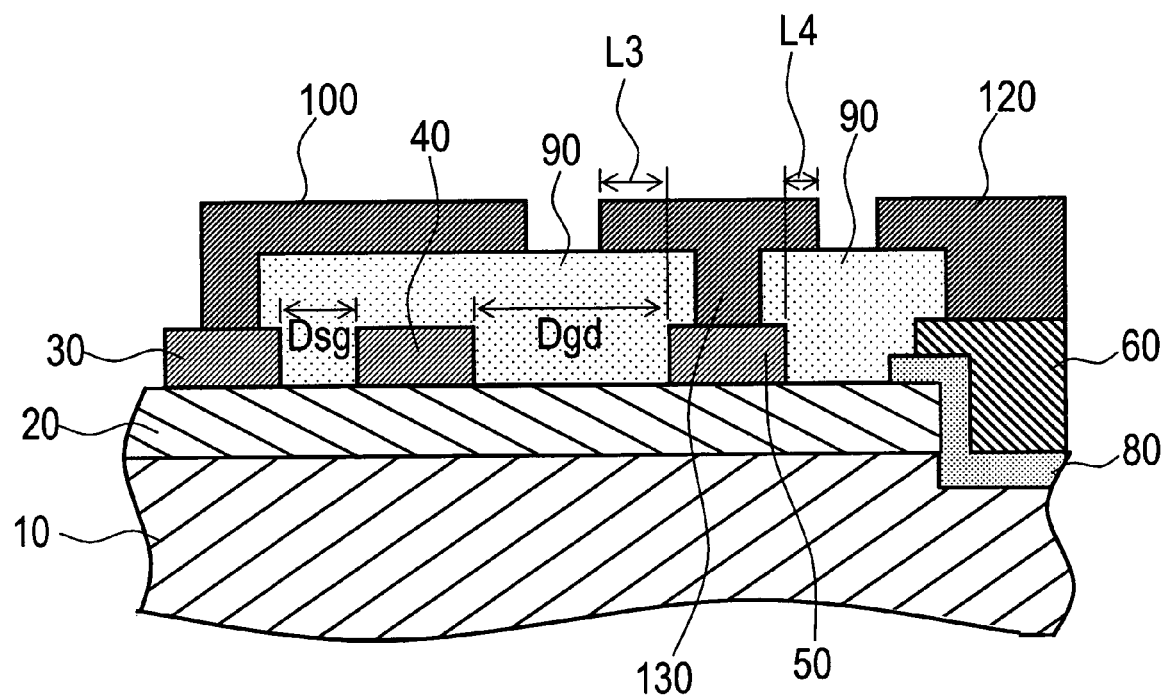
FIG. 19 is a cross section showing a seventeenth example of the nitride semiconductor device of this embodiment.

FIG. 19 is a cross section showing a seventeenth example of the nitride semiconductor device of this embodiment.

In this example, a fourth field plate 130 connected to the drain electrode 50 passes through and extends on the insulating film 90. The field plate electrode 130 can further improve the withstand voltage of the entire device. Here, the fourth field plate 130 extends a distance L3 toward the gate electrode 40 and also extends a distance L4 toward the hole extracting electrode 60. In order to ensure that avalanche breakdown occurs between the hole extracting electrode 60 and the drain electrode 50, it is desirable that the distance L3 from the end portion of the drain electrode 50 to the tip (on the gate side) of the field plate electrode 130 be longer than the distance L4 from the end portion of the drain electrode to the tip (on the hole extracting electrode side) of the field plate electrode 130 (L3>L4).

The embodiment of the invention has been described with reference to the examples. However, the invention is not limited to these examples.

For example, the material, shape, and patterning of each element constituting the inventive nitride semiconductor device that are adapted by those skilled in the art are also encompassed within the scope of the invention as long as they include the features of the invention.

For example, while the combination of a GaN layer and an AlGaN layer is described in the embodiment of the invention, the same effects as described above can also be achieved by combinations of nitride semiconductors such as a pair of a GaAs layer and an AlGaAs layer, a pair of a GaN layer and an InGaN layer, a pair of an AlN layer and an AlGaN layer, and a pair of a BAlN layer and a GaN layer.

While an undoped AlGaN layer is used in the embodiment of the invention, an n-type AlGaN layer can also be used.

The structures of the examples can be combined with each other as long as technically feasible, and any nitride semiconductor devices obtained by such combinations are also encompassed within the scope of the invention.

Furthermore, the gate-drain structure of the HFET used in the embodiment of the invention is similar to the structure of a hetero-Schottky barrier diode (HSBD). Therefore an HSBD with high withstand voltage is achieved using this embodiment.

The gate electrode in the examples described above forms a Schottky junction. However, a MIS (Metal-Insulator-Semiconductor) gate structure, which is obtained by forming a gate insulating film between the gate electrode and the AlGaN barrier layer, can also achieve avalanche withstand capability.

Figure 20:
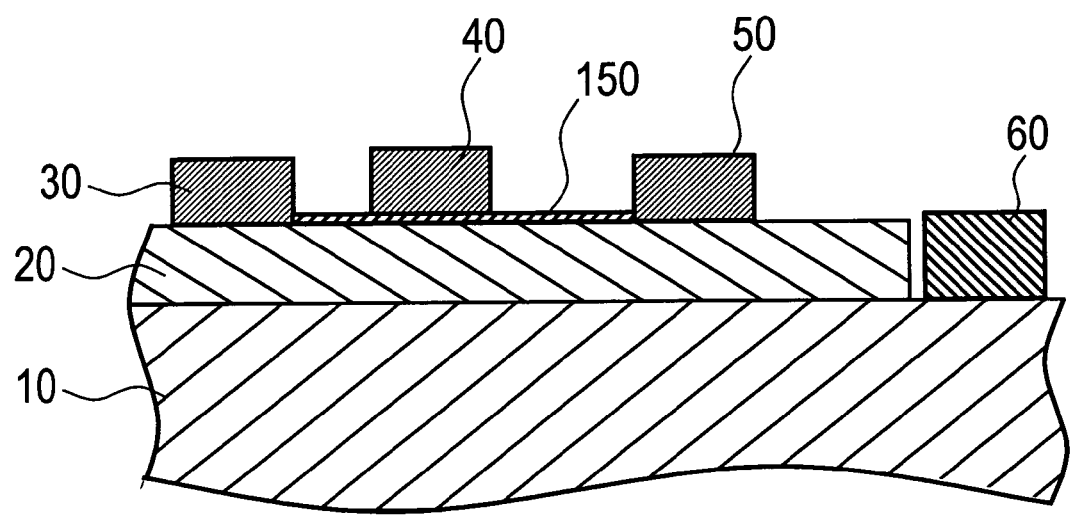
FIG. 20 is a cross section showing an eighteenth example of the nitride semiconductor device of this embodiment.

FIG. 20 is a cross section illustrating a nitride semiconductor device of the MIS gate type.

Such a nitride semiconductor device of the MIS gate type, which has a gate insulating film 150 between the AlGaN barrier layer 20 and the gate electrode 40, can also achieve similar functions and effects through similar application of the invention.

The supporting substrate used for forming the GaN layer or the AlGaN layer may also be made of substrate materials such as a sapphire substrate, a silicon carbide (SiC) substrate, a Si substrate, or a GaN substrate.

The "nitride semiconductor" used herein includes semiconductors having any composition represented by the chemical formula $B_xAl_yGa_zIn_{1-x-y-z}N$ ($0\leq x\leq 1$, $0\leq y\leq 1$, $0\leq z\leq 1$, $x+y+z\leq 1$) where the composition ratios x, y, and z are varied in the respective ranges. Furthermore, the "nitride semiconductor" also includes those further containing any of various impurities added for controlling conductivity types.

The invention claimed is:

1. A nitride semiconductor device comprising:
   a laminated body including a first semiconductor layer of a nitride semiconductor and a second semiconductor layer of a nondoped or n-type nitride semiconductor having a wider bandgap than the first semiconductor layer, the second semiconductor layer being provided on the first semiconductor layer;
   a control electrode provided in a first region on a major surface of the laminated body;
   a first and second main electrode provided in a second and third region, respectively, adjacent to either end of the first region on the major surface of the laminated body; and
   a third main electrode provided on the major surface of the laminated body, the second main electrode being provided between the control electrode and the third main electrode, and the spacing between the control electrode and the second main electrode being larger than the spacing between the second main electrode and the third main electrode.

2. The nitride semiconductor device according to claim 1, wherein the third main electrode is electrically connected to the first main electrode.

3. The nitride semiconductor device according to claim 1, wherein the third main electrode is electrically connected to the control electrode.

4. The nitride semiconductor device according to claim 1, wherein the third main electrode is in contact with the first semiconductor layer.

5. The nitride semiconductor device according to claim 1, wherein the third main electrode is buried into the second semiconductor layer.

6. The nitride semiconductor layer according to claim 1, wherein the third main electrode penetrates the second semiconductor layer and is buried into the first semiconductor layer.

7. The nitride semiconductor device according to claim 1, wherein the control electrode is provided in a recess portion which is formed on the second semiconductor layer.

8. The nitride semiconductor device according to claim 1, wherein the third main electrode is connected to the first semiconductor layer via a p-type semiconductor layer.

9. The nitride semiconductor device according to claim 8, wherein the p-type semiconductor layer is made of p-type InGaN.

10. The nitride semiconductor device according to claim 6, wherein the p-type semiconductor layer is made of polycrystalline silicon.

11. The nitride semiconductor device according to claim 1, wherein the control electrode is connected to the second semiconductor layer via a p-type semiconductor layer.

12. The nitride semiconductor device according to claim 1, wherein an insulating film is provided between the control electrode and the second semiconductor layer.

13. A nitride semiconductor device comprising:
    a laminated body including a first semiconductor layer of a nitride semiconductor and a second semiconductor layer of a nondoped or n-type nitride semiconductor having a wider bandgap than the first semiconductor layer, the second semiconductor layer being provided on the first semiconductor layer;
    a control electrode provided directly, or via an insulating film, in a first region on a major surface of the laminated body;
    a first and second main electrode provided in a second and third region, respectively, adjacent to either end of the first region on the major surface of the laminated body; and
    a third main electrode provided on the major surface of the laminated body, the second main electrode being provided between the control electrode and the third main electrode,
    the spacing between the control electrode and the second main electrode being larger than the spacing between the second main electrode and the third main electrode.

14. The nitride semiconductor device according to claim 13, wherein the third main electrode surrounds the first main electrode, the control electrode and the second main electrode.

15. The nitride semiconductor device according to claim 13, wherein the second main electrode surrounds the third main electrode.

16. The nitride semiconductor layer according to claim 13, wherein the third main electrode penetrates the second semiconductor layer and is buried into the first semiconductor layer.

17. The nitride semiconductor device according to claim 13, wherein:
    the first main electrode is a source electrode;
    the second main electrode is a drain electrode;
    the control electrode is a gate electrode;
    the third main electrode is a hole extracting electrode; and
    the semiconductor device further comprising:
    a first insulating film overlying the gate electrode; and
    a field plate electrode provided on the first insulating film and connected to the source electrode or the gate electrode.

18. The nitride semiconductor device according to claim 17, further comprising a second field plate electrode provided on the first insulating film and connected to the drain electrode.

19. The nitride semiconductor device according to claim 17, further comprising:
    a second insulating film provided on the second semiconductor layer between the drain electrode and the hole extracting electrode; and
    a third field plate electrode provided on the second insulating film and connected to the hole extracting electrode.

20. The nitride semiconductor device according to claim 19, further comprising a fourth field plate electrode provided on the second insulating film and connected to the drain electrode.

* * * * *